United States Patent
Stewart (10) Patent No.: US 9,038,831 B2
(45) Date of Patent: May 26, 2015

(54) DISASTER RESISTANT SYSTEM FOR MAINTAINING OPERATION OF COMPUTING DEVICES MOUNTED WITHIN STORAGE RACKS DURING WATER AND OTHER RELATED CONTAMINATING EVENTS

(71) Applicant: ORACLE INTERNATIONAL CORPORATION, Redwood City, CA (US)

(72) Inventor: Thomas E. Stewart, San Diego, CA (US)

(73) Assignee: Oracle International Corporation, Redwood City, CA (US)

( * ) Notice: Subject to any disclaimer, the term of this patent is extended or adjusted under 35 U.S.C. 154(b) by 311 days.

(21) Appl. No.: 13/686,136

(22) Filed: Nov. 27, 2012

(65) Prior Publication Data

US 2014/0144852 A1 May 29, 2014

(51) Int. Cl.
*H02G 1/06* (2006.01)
*H05K 7/14* (2006.01)

(52) U.S. Cl.
CPC ............... *H02G 1/06* (2013.01); *H05K 7/1488* (2013.01)

(58) Field of Classification Search
CPC ......... H02G 1/06; H05K 7/1488; H05K 7/18; H05K 7/14; H05K 7/1492; H05K 7/1491; H05K 7/1495; H02B 1/301; H02B 1/305; H02B 1/28
USPC ........... 211/26; 312/265.1–265.6, 228.1, 229, 312/100, 213, 223.1; 174/50
See application file for complete search history.

(56) References Cited

U.S. PATENT DOCUMENTS

| | | | | |
|---|---|---|---|---|
| 5,798,485 A | * | 8/1998 | Rohde et al. | 174/383 |
| 5,801,331 A | * | 9/1998 | Zachrai | 174/541 |
| 5,897,180 A | * | 4/1999 | Singer | 312/265.3 |
| 5,957,555 A | * | 9/1999 | Kohler et al. | 312/100 |
| 6,102,498 A | * | 8/2000 | Kohler et al. | 312/223.1 |
| 6,238,029 B1 | * | 5/2001 | Marzec et al. | 312/265.3 |
| 6,293,637 B1 | * | 9/2001 | Anderson et al. | 312/265.1 |
| 6,401,940 B1 | * | 6/2002 | Hartel et al. | 211/26 |
| 6,736,277 B2 | | 5/2004 | Lauchner et al. | |
| 6,796,833 B2 | | 9/2004 | Baker | |
| 6,854,605 B2 | | 2/2005 | Wrycraft | |
| 7,116,558 B2 | | 10/2006 | Sugihara | |
| 7,189,924 B1 | | 3/2007 | Popescu et al. | |
| 7,718,889 B2 | * | 5/2010 | Rasmussen et al. | 174/50 |
| 8,240,490 B2 | | 8/2012 | Malekmadani | |
| 8,684,476 B2 | * | 4/2014 | Rangwala | 312/229 |
| 2004/0182799 A1 | * | 9/2004 | Tachibana | 211/26 |
| 2007/0096608 A1 | * | 5/2007 | Benner et al. | 312/294 |

(Continued)

*Primary Examiner* — Patrick Hawn
(74) *Attorney, Agent, or Firm* — Marsh Fischmann & Breyfogle LLP; Jonathon A. Szumny (57) ABSTRACT

A system for use with a computing rack that prolongs operation of computing devices mounted within the rack in the event of a contaminant (e.g., liquid, debris) related event (e.g., natural disaster, activation of an overhead sprinkler system, etc.) by channeling or diverting contaminants attempting to enter a top portion of the rack towards an outer periphery of the rack before such contaminants have a chance to contact the computing devices. The disclosed system may include a plurality of channeling devices (e.g., sheets, panels, plates) secured to the rack framework at an angle thereto and generally adjacent the top of the rack (e.g., or at least above the highest location at which a computing device is to be mounted) for routing contaminants (e.g., via gravity) away from the computing devices.

20 Claims, 4 Drawing Sheets

(56) References Cited

U.S. PATENT DOCUMENTS

| | | | |
|---|---|---|---|
| 2008/0129164 A1* | 6/2008 | Walsh | 312/228.1 |
| 2010/0097752 A1* | 4/2010 | Doll et al. | 361/679.48 |
| 2011/0181159 A1* | 7/2011 | Rangwala | 312/223.1 |
| 2011/0181161 A1* | 7/2011 | Hsiao | 312/223.1 |

* cited by examiner

DISASTER RESISTANT SYSTEM FOR MAINTAINING OPERATION OF COMPUTING DEVICES MOUNTED WITHIN STORAGE RACKS DURING WATER AND OTHER RELATED CONTAMINATING EVENTS

BACKGROUND

1. Field of the Invention

The present invention generally relates to computing or storage racks (e.g., cabinets, libraries) for holding computing devices or field replaceable units (FRUs) such as servers, tape drives, and the like and, more particularly, to systems and devices that can prolong operation of computing devices mounted within a rack or other enclosure in the event that contaminants such as liquids attempt to enter the rack via a top of the rack, such as from a natural disaster, an overhead sprinkler system, and/or the like.

2. Relevant Background

Computing racks are standardized frames that are designed to hold a plurality of computing devices or related components (e.g., rack-mounted servers, power distribution units or backup devices, hard drives, and/or other types of FRUs) in, for instance, a stacked or side by side manner. Generally, rack systems include a mechanical framework made up of a number of vertical support members (e.g., posts, Radio Electronics Television Manufacturers Association ("RETMA") rails) extending upward from a floor or other platform and defining a space therewithin into which FRUs may be inserted. Typically, the vertical support members define a plurality of "bays," where each bay is configured to receive a corresponding FRU. Each bay may have a standardized height in one or more multiples of a rack unit (U) to correspond with correspondingly sized FRUs. For instance, industry standard rack systems often come in heights of 18U, 22U, 36U, 42U, and the like. Also, a rack system may be in the form of a 19-inch rack (i.e., the width between the front two vertical members may be 19"), a 23-inch rack, or the like.

It is generally desirable for each FRU to be installed and/or serviced without affecting operation of the other FRUs, and, in many cases, it is desirable for each FRU to be maintained or accessed without disconnecting it from power or communications/network links (e.g., to provide hot swappable and maintainable servers in an enterprise or data center environment). To this end, each FRU may be mounted within a bay of the rack using a rail, slide or rack-mount kit. A rail kit typically includes a pair of outer rail assemblies, each of which is attached to vertical support members of the rack and extends horizontally to define a server mounting location within a bay of the rack. Each outer rail assembly may be mated or otherwise interconnected with a middle rail or middle member of the rail kit. The middle rail often will be supported within an inner channel or groove of the outer rail assembly and the middle rail may be positioned by sliding within the outer rail assembly between refracted and extended positions. In the extended position, the middle rails typically extend outward from the ends of the outer rail assemblies several inches to a foot or more to allow access to an attached or supported server or other computing device. In the refracted position, the middle rail has its outer end positioned within the outer rail.

To mount a server in the rack, a pair of inner or rack rails is attached to an outer surface of a server (or other computer device) chassis, and each of the inner or rack rails is coupled with or otherwise interconnected to a corresponding one of the middle members or rails. Generally, a server is mounted within the server storage rack by extending out the middle rail, aligning the ends of the both of the inner or rack rails on the server chassis with the ends of the middle rails, and, once proper alignment is achieved on both sides, pushing on the server chassis to cause the inner rails or racks to mate or couple with the middle members or rails (e.g., in a tongue-and-groove manner) as the inner rails slide within channels or grooves of the middle member or rails. Continued pushing then causes the middle member or rail to slide within the outer rail or member from the extended position to the retracted position, which allows the storage rack door to be closed.

SUMMARY

It is important to maintain or otherwise prolong operation of computing and other electronic devices (e.g., FRUs) mounted within a storage rack in the event that "contaminants" (e.g., water, other liquids, dust, debris, etc.) attempt to breach the rack and contact such computing devices. In the case of natural disasters such as hurricanes, flooding, and/or other such weather events, for example, it is highly advantageous for enterprise servers (e.g., running cell phones, landline phones, computer networks, television services, etc.) to remain operational (i.e., the longer a server can run in an emergency free of human intervention, the better). For instance, water could enter a server room if windows get blown out by a storm or if a tidal surge or rain was to penetrate parts of a building that is running telecommunications equipment. If the water was to enter the building at a location above where the servers are stored, the water could enter through a top portion of a server rack and damage the servers stored thereinside; this type of situation could result in, for instance, a person in a precarious situation being unable to place a 911 call due to damage to cellular and/or landline network servers.

In an attempt to protect the FRUs of a rack from damage due to contaminants so as to prolong operation of the devices (in addition to increasing the structural integrity of the rack and/or providing for a more aesthetically pleasing appearance), a rack is often outfitted with a plurality of panels and/or doors secured to the front, rear, sides, top and/or bottom of the framework. For instance, various industries are often required to comply with key industry requirements (e.g., such as the guidelines provided in Network Equipment-Building System (NEBS)) for how to design and build reliable electronics for telecom network use.

As an example, the top of a rack often includes one or more panels horizontally secured over or to the vertical support members for purposes of limiting the intrusion of contaminants into the rack that may otherwise serve to inhibit functioning of the FRUs mounted thereinside. Some racks include top panels that are substantially devoid of any apertures or openings to substantially fully limit the entry of contaminants into the inside of the rack. However, failing to include any apertures through the top panel or other structure of a rack limits the venting of heat generated by the FRUs within the rack thus leading to performance inefficiencies.

Other racks include top panels that include one or more apertures, slots, and/or other openings for ventilation, cable routing, and/or the like which facilitates heating venting and air circulation through the rack. However, the apertures or openings can allow for the intrusion of contaminants into the rack which may come into contact with one or more of the FRUs possibly leading to reduced FRU performance or even failure (e.g., due to water from sprinkler systems, spilled drinks left on top of the rack, and the like). Furthermore, cabling extending through the top panel(s) and/or other locations to the FRUs can serve as an almost direct conduit for contaminants to contact the FRUs (e.g., via water flowing along the cabling from the top of the rack down to one or more of the FRUs).

In this regard, disclosed herein is a system for use with a computing rack that simultaneously allows for ventilation through a top panel or panels of the rack while preventing or at least inhibiting contaminants from entering through the top panel and contacting or otherwise interfering with FRUs mounted within the rack. As will be discussed, the disclosed system serves to channel or route contaminants entering a top panel or panels of a rack towards an outer periphery of the rack (e.g., adjacent the vertical support members) so that such contaminants fall or drop down along the outer periphery of the rack instead of over and onto the FRUs in the rack. As a result, damage to and/or interruptions to proper functioning of FRUs mounted within the rack can be limited or reduced in the case of, for instance, water and/or other related events. The disclosed system may include a plurality of contaminant channeling or guiding devices such as baffles (e.g., sheets, panels, plates) or the like secured generally adjacent the top of the rack (e.g., above a highest location at which a FRU is to be mounted) so as to route contaminants (e.g., via gravity) away from the FRUs.

Each contaminant channeling device may have at least one surface that slopes downwardly towards the outer periphery of the rack. For instance, each device may be angled so that a first edge or portion of the device (e.g., adjacent the outer periphery of the rack) is spaced from a top panel or portion of the rack by a first distance and so that an opposed second edge or portion of the device is spaced from the top panel or portion of the rack by a second distance less than the first distance. That is, each device may be secured to the frame (e.g., to first and second of the vertical support members) at a non-perpendicular angle (e.g., such as at an acute angle in a direction facing the top portion of the rack). In one arrangement, successive angled devices may at least partially overlap each other to create one or more chambers sloping towards the outer periphery of the rack for holding or containing a bundle or loop of cabling to route any contaminants flowing down the cabling away from instead of towards the FRUs.

Each channeling device may also be spaced from adjacent devices to create pathway through the plurality of devices for the escape of heat generated within the rack (e.g., by the FRUs) as well as routing of cables and wires. As at least two of the channeling devices may overlap each other, the system eliminates or at least reduces the occurrence of direct, substantially perpendicular and unobstructed pathways from the top portion of the rack to or towards any computing devices mounted in the rack that would otherwise facilitate substantially direct access to the computing devices by contaminants. In one arrangement, the various channeling devices may be incorporated into any ruggedizing support members disposed adjacent a top of the rack included in the rack to comply with NEBS guidelines. In this regard, the channeling devices may serve to route contaminants away from computing devices mounted in the rack free of utilizing space in the rack that would not otherwise be utilized by computing devices in the first place.

In one aspect, a storage rack for supporting one or more computing devices includes a framework having opposing top and bottom portions, a plurality of side portions extending between the top and bottom portions, and a storage area between the top, bottom, and plurality of side portions for storing one or more computing devices; and a plurality of channeling devices secured to the framework above the storage area for channeling contaminants (e.g., liquids, debris, and/or the like) towards an outer periphery of the framework (e.g., via action of gravity). The channeling devices include a first channeling device secured to a first of the side portions of the framework and a second channeling device secured to a second of the side portions of the framework. Second portions of each of the first and second channeling devices are disposed closer to the top portion of the framework than are opposed first portions of the first and second channeling device for respectively routing contaminants towards the first and second side portions of the framework. Additionally, the first and second channeling devices at least partially overlap each other.

In another aspect, a system for diverting contaminants away from computing devices in a storage rack includes a plurality of vertical support members collectively defining a storage area for storing a plurality of computing devices, where the storage area comprises a top portion, an opposed bottom portion, and an interior cross-sectional space; a first channeling device secured within the storage area adjacent a first pair of the vertical support members, where the first channeling device forms an acute angle with the first pair of vertical support members in a direction facing the top portion of the storage area; and a second channeling device secured within the storage area adjacent a second pair of the vertical support members, where the second channeling device forms an acute angle with the second pair of vertical support members in a direction facing the top portion of the storage area. The first and second channeling devices collectively fill a substantial entirety of the interior cross-sectional space of the storage area.

In a further aspect, a method of routing a cable between an exterior of a storage rack and an interior of the storage rack includes passing an end of a cable from an exterior of a storage rack through an opening in a top panel of the storage rack, the storage rack including a plurality of bays for receiving a respective plurality of computing devices; guiding the end of the cable into a contaminant removal chamber located above the plurality of bays and configured to channel contaminants towards an outer periphery of the storage rack via gravity; and moving the end of the cable out of the contaminant removal chamber. A resulting cable path of the cable extends a) through the opening in the top panel of the storage rack, b) into the contaminant removal chamber, and then c) out of the contaminant removal chamber for connection with one of the bays or computing devices.

Any of the embodiments, arrangements, or the like discussed herein may be used (either alone or in combination with other embodiments, arrangement, or the like) with any of the disclosed aspects. Merely introducing a feature in accordance with commonly accepted antecedent basis practice does not limit the corresponding feature to the singular. Any failure to use phrases such as "at least one" does not limit the corresponding feature to the singular. Use of the phrase "at least generally," "at least partially," "substantially" or the like in relation to a particular feature encompasses the corresponding characteristic and insubstantial variations thereof. Furthermore, a reference of a feature in conjunction with the phrase "in one embodiment" does not limit the use of the feature to a single embodiment.

In addition to the exemplary aspects and embodiments described above, further aspects and embodiments will become apparent by reference to the drawings and by study of the following descriptions.

DETAILED DESCRIPTION

Disclosed herein is a disaster resistant system for use with a server or computing rack (e.g., cabinet) that is configured to prolong operation of computing devices mounted within the rack in the case of a water related event (e.g., natural disaster, activation of a sprinkler system, spilled drink on top of the rack, and/or the like) by limiting or inhibiting any such contaminants from entering the rack via a top panel or portion of the rack and contacting with and/or otherwise causing damage to sensitive computing devices mounted within the rack. The disclosed system includes a number of channeling devices (e.g., baffle plates, ramping surfaces, and/or the like) secured generally adjacent a top of the rack (e.g., either inside or outside the rack) and that may be arranged somewhat similar to the apex of a roof so as to route contaminants towards an outer periphery of the rack via gravity, such as to opposing portions of the outer periphery. Contaminants routed to the outer portion or periphery of the rack may be routed into any appropriate arrangement of gutters and/or channels secured adjacent the outer periphery of the rack that serve to guide such contaminants towards a bottom portion of the rack and eventually away from the rack and the computing devices thereinside. Cables and other wiring routed through the top portion or panel of the rack may be routed over at least one of the channeling devices before being routed between and through the channeling devices (for connection to computing devices mounted in the rack) for purposes of collecting and routing any contaminants carried by the cables/wires from the exterior of the rack (e.g., overhead sprinkler systems) away from the computing devices and towards the outer periphery of the rack.

Figure 1:
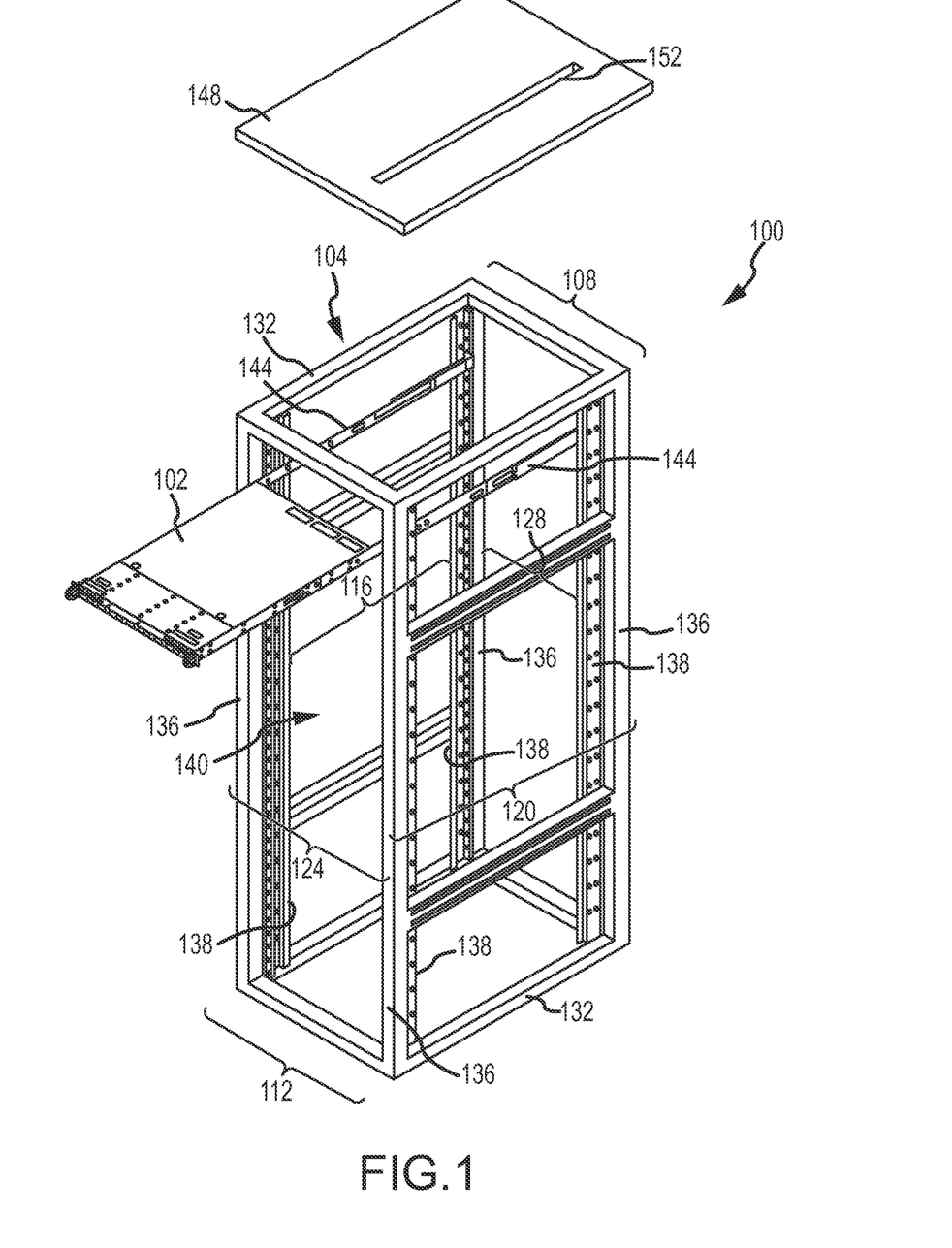
FIG. 1 is a perspective view of a storage rack according to one embodiment.

FIG. 1 is a perspective view of one embodiment of a storage rack 100 (e.g., cabinet) operable to store one or more computing or electronic devices 102 (e.g., servers, hard disk drives, and/or the like) in a stacked or side by side manner. Broadly, the rack 100 may include a framework 104 generally including a top portion 108, a bottom portion 112, and a plurality of side portions extending between the top and bottom portions 108, 112 such as a first (e.g., left) side portion 116, second (e.g., right) side portion 120, third (e.g., front) side portion 124, and fourth (e.g., rear) side portion 128. Each of the top and bottom portions 108, 112 may include a plurality of horizontal support members 132 while each of the side portions 116, 120, 124, 128 may include a plurality of vertical support members 136 extending upwardly from a floor or platform (not shown).

The various portions of the framework 104 generally collectively define a storage space 140 within the framework 104 for receiving a plurality of computing devices 102 therein, where the storage space 140 has a top portion (not labeled) generally coincident with the top portion 108 of the framework 104 and a bottom portion (not labeled) generally coincident with the bottom portion 112 of the framework 104. As shown, each vertical support member 136 may include or at least be associated with (or in some arrangements be in the form of) a respective perforated vertical rail 138 (e.g., a vertical RETMA rail), where the plurality of vertical support members 136 and rails 138 may collectively serve to define a plurality of bays arranged in a vertically stacked manner between the top and bottom portions 108, 112 of the framework 104.

Each bay may include a respective pair of rail assemblies 144 (only one shown in FIG. 1) for slidably receiving a respective computing device 102 in the storage space 140. For instance, each pair of rail assemblies 144 may allow a respective computing device 102 to slidably translate between an expanded position (e.g., as shown in FIG. 1) and a retracted/storage position within the storage space 140 underneath the top portion 108. Furthermore, each bay may have a standardized height in multiples of one rack unit (U) to correspond with correspondingly sized computing devices 102. For instance, the framework 104 may have any appropriate height such as 18U, 22U, 36U, 42U, and the like, and any appropriate width such as 19 inches, 23 inches, and/or the like. Also, the openings (not labeled) disposed between the various horizontal and vertical support members 132, 136 may be covered by any appropriate paneling and/or the like (e.g., panels, windows, access doors) including any number of openings, slots, and/or the like therethrough (e.g., for routing or cables and/or wires, ventilation to reduce operating temperatures of the computing devices, etc.).

For instance, the rack 100 may include a top panel 148 (shown exploded from the framework 104 in FIG. 1) having at least one aperture 152 (e.g., elongated slot) that may be secured over and/or to the top portion 108 of the framework 104 in any appropriate manner. The aperture 152 may be used to route cables and wires from an external location (e.g., from an overhead location on a ceiling and/or the like) into the storage space 140 of the rack 100, facilitate ventilation in the rack 100, etc. One or more other apertures (e.g., perforations) may also be formed through the top panel 148 and or other panels (not shown in the interest of clarity). For instance, the aperture 152 and/or other openings in the top panel(s) 148 may be necessary for telecommunications installations in which cabling for power to the rack and interconnection to the network is required to be through the top panel. The various panels disposed over the openings between the horizontal and vertical support members 132, 136 be considered part of the framework 104 (e.g., the top panel 148 may be considered part of the top portion 108 of the framework 104). In addition to at least partially defining the storage space 140, the vertical support members 136, rails 138 and any paneling therebetween generally also collectively define an outer periphery of the rack 104. Although the rack 100 has been depicted as a box like structure, this is not intended to be a limitation on the present disclosure. For instance, an open shelving style system could also be constructed, additional side panels could be installed so that multiple sub-boxes exist within a larger box, and/or the like. Furthermore, the various components of the rack 100 may be formed of metal, plastic, and/or the like.

As discussed previously, the openings, slots, and the like within the paneling (e.g., top panel 148 of the top portion 108) can facilitate seepage, dripping, flowing, and/or the like of one or more types of contaminants (e.g., water, dust, other debris, etc.) into the storage space 140 that can cause damage to computing devices 102 and/or other componentry in the storage space 140. For instance, in the event that an overhead sprinkler system turns on and begins spraying water on the top portion 108 of the rack 100, water can flow or drip through the openings in the paneling of the top portion 108 (e.g., through aperture 152 of top panel 148) and begin falling over and onto the computing devices 102. Furthermore, any cables and/or wires (e.g., overhead cables and/or wiring) passing through the top paneling into the storage space 140 can function as substantially direct conduits of water or other contaminants to the computing devices 102 and/or other sensitive componentry in the storage space 140. More specifically, water can seep or flow down a cable toward or even into a port in the back of a computing device 102 which can cause damage to the computing device 102. While outfitting the rack 100 with paneling devoid or substantially devoid of apertures can limit the intrusion of contaminants into the storage space 140, doing so has the drawback of inhibiting proper ventilation of computing devices 102 mounted within the storage space 140.

Figure 2:
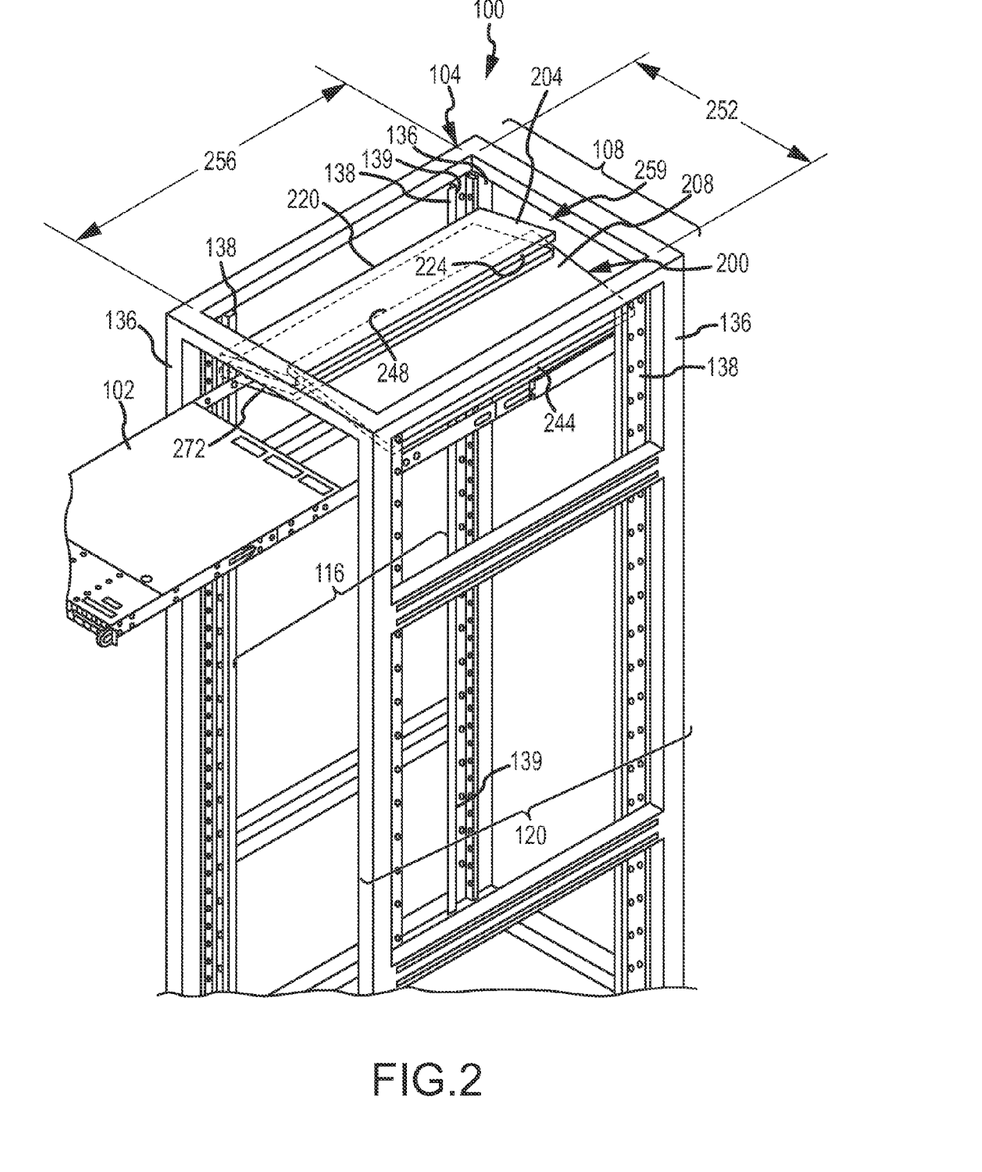
FIG. 2 is a close-up perspective view of the storage rack of FIG. 1 and illustrating a contaminant removal system useful for diverting contaminants away from computing devices mounted in the storage rack, according to one embodiment.
Figure 3:
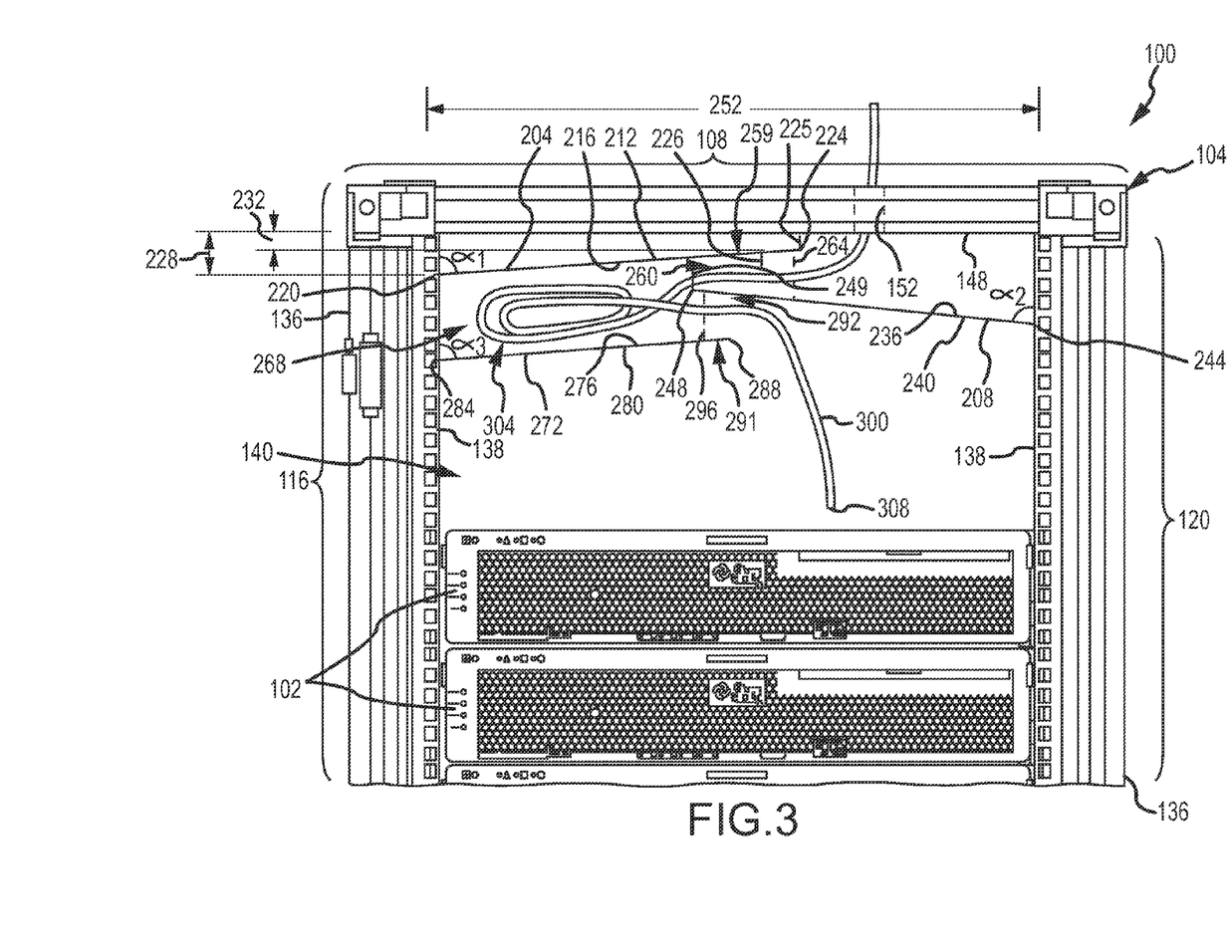
FIG. 3 is a front elevation view of the storage rack and contaminant removal system of FIG. 2.

In this regard, and turning now to FIGS. 2-3, disclosed herein is a system 200 for use with rack 100 (e.g., or other electronic racks/chassis) that is operable to simultaneously allow for ventilation through a top portion 108 of the framework 104 (e.g., via aperture 152 in top panel 148) while channeling or diverting contaminants (e.g., liquids, debris, etc.) that have entered the rack 100 via the top portion 108 away from computing devices 102 mounted within the rack 100. Broadly, the system 200 includes a plurality of channeling devices, such as at least first and second channeling devices 204, 208, each of which is operable to channel contaminants that have penetrated or otherwise passed through the top portion 108 of the framework 104 and entered the storage space 140 of the rack 100 towards an outer periphery of the framework (e.g., via gravity) and thus away from any computing devices 102 mounted in the storage area 140. Each of the channeling devices may be secured to the framework 104 and generally disposed above one or more of the bays of the rack 100, such as at or above a highest bay or location within the storage space 140 that a computing device 102 is to be secured and/or mounted (e.g., closer to the top portion 108 of the rack 100 than a highest such bay or computing device 102).

In one arrangement, each of the channeling devices may be in the form of a baffle plate (e.g., drip pan) secured to the framework 104 that is substantially free or devoid of apertures therethrough, such as free of apertures therethrough at least directly over the computing device(s) 102, to limit passage of contaminants through the baffle plate. For instance, the first channeling device 204 may include opposing first and second surfaces 212, 216 and opposing first and second portions (e.g., edges) 220, 224, where the first portion 220 is secured to or at least adjacent the first side portion 116 of the framework 104 at a first distance 228 from the top portion 108, and where the second portion 224 extends into the storage space 140 of the rack 100 and is spaced from the top portion 108 by a second distance 232 less than the first distance 228. Similarly, the second channeling device 208 may include opposing first and second surfaces 236, 240 and opposing first and second portions (e.g., edges) 244, 248, where the first portion 244 is secured to or at least adjacent the second side portion 120 of the framework 104 at a first distance (not labeled) from the top portion 108, and where the second portion 248 extends into the storage space 140 of the rack 100 and is spaced from the top portion 108 by a second distance (not labeled) less than the first distance.

In this regard, each of the first and second channeling devices 204, 208 (and/or other channeling devices) may have a surface thereof (e.g., first surfaces 212, 236) that forms an acute angle α with the framework 104 (e.g., $α_1$, $α_2$, etc.) in a direction generally facing the top portion 108 of the framework 104. This arrangement advantageously facilitates channeling or routing of contaminants towards the outer periphery of the rack 100 away from the computing device(s) 102 by way of gravity. In one embodiment, each acute angle α (which may be the same as or different than the other acute angles α) may be no less than about 65°, such as no less than about 70° (e.g., to limit the amount of vertical space consumed in the storage space 140 that could otherwise be utilized by computing devices 102). In another embodiment, each acute angle α may be no more than about 85°, such as no more than about 80° (e.g., to allow the effect of gravity to appropriately shed contaminants towards the outer periphery of the rack 100).

The first portions 220, 244 of the first and second channeling devices 204, 208 may be respectively secured to the vertical support members 136 and/or rails 138 of the first and second side portions 116, 120 in any appropriate manner (e.g., brackets, bolts, and/or the like). In one arrangement, the first and second channeling devices 204, 208 may be mounted to the first and second side portions 116, 120 so as to route contaminants into any appropriate channels or conduits extending downward along the first and second side portions 116, 120 so as to route such contaminants towards the bottom portion 112 of the rack (e.g., such as towards a drain, collection system, etc.). For instance, the first and second channeling devices 204, 208 may be arranged to route contaminants into respective channels 139 of the rails 138 which may facilitate routing of the contaminants towards the bottom portion 112 and eventually away from the computing devices 102. While channels 139 have been shown in the rails 138, channels, conduits or the like may additionally or alternatively be formed or disposed in other components adjacent the outer periphery of the rack (e.g., in the paneling).

The first and second channeling devices 204, 208 may also be arranged to collectively span a substantial entirety of an interior cross-sectional space of the storage space 140 so as to intercept contaminants falling or passing through substantially any part of the top portion 108 of the framework 104 and route the same via force of gravity to the outer periphery of the rack 100 (i.e., instead of allowing the same to fall onto and contact one or more computing devices 102 in the storage space 140). Stated differently, the first and second channeling devices 204, 208 (and/or other channeling devices) may be arranged to generally match an interior shape of the storage space 140 to limit or reduce contaminant paths to the computing devices 102 in the storage space 140.

In one arrangement, the first and second channeling devices 204, 208 may collectively span a first dimension 252 (e.g. a width) of the framework 104 extending between the first and second side portions 116, 120, and may each span a substantial entirety of a second dimension 256 (e.g., a depth) of the framework 104 extending between the third and fourth side portions 124, 128. In the former regard, the first and second channeling devices 204, 208 may be arranged so as to at least partially overlap each other along the first dimension 252. See FIGS. 2-3. Stated differently, the first and second channeling devices 204, 208 may respectively extend out from the first and second side portions 116, 120 of the framework 104 more than half the distance between the first and second side portions 116, 120 (i.e., more than half of the first dimension 252) so as to overlap in an overlap region 259. For instance, the overlap region 259 may comprise at least about 3% of the first dimension 252, such as at least about 5% of the first dimension 252 (e.g., to limit contaminants from falling between and through the first and second channeling devices 204, 208). As another example, the overlap region 259 may be no more than about 15% of the first dimension 252, such as no more than about 10% of the first dimension 252 (e.g., to limit difficulties in routing cabling between the first and second channeling devices 204, 208).

The overlap region 259 (and other overlap regions of respective pairs of channeling devices) may include a passage 260 (e.g., space, slot, etc.) between the first and second channeling devices 204, 208 to facilitate air flow/ventilation between the storage space 140 and the exterior of the rack 100 (e.g., via opening 152 and/or other openings of the top panel 148), cable/wire routing (e.g., see cable 300) through or between the first and second channeling devices 204, 208, and the like. For instance, the second portion 248 of the second channeling device 208 may be spaced farther from the top portion 108 of the framework 104 than is the second portion 224 of the first channeling device 204. For instance, a minimum spacing of the passage 260 between the first and second channeling devices 204, 208 may be at least about 15 mm, such as at least about 25 mm (e.g., to allow for at least some cables to be routed between the channeling devices 204, 208). As another example, a maximum spacing of the passage 260 may be no more than about 85 mm, such as no more than about 75 mm (e.g., to limit the amount of vertical space consumed in the storage space 140 that could otherwise be utilized by computing devices 102). In one embodiment, one or more perforated connection members 264 (e.g., brackets, plates, etc.) may be secured between (e.g., via welding or the like) or otherwise interconnect the first and second channeling devices 204, 208 for purposes of adding rigidity to the system 200, containing or otherwise holding the cable 300 against movement (e.g., where the cable 300 would pass through a perforation of a connection member 264), and/or the like.

As discussed previously, cables and wires (e.g., cable 300) can sometimes act as direct conduits of contaminants (e.g., water, condensation) from locations outside or even inside the rack 100 to computing devices 102 and/or other components within the storage space 140 (e.g., via water/condensation flowing down an outside surface of the cable 300). To limit the degree to which the cable 300 can serve as such a direct conduit of contaminants, the cable 300 can be at least partially coiled to collect contaminants flowing down the cable 300, and disposed over at least one of the channeling devices to route such collected contaminants toward the outer periphery of the rack away from the computing device(s) 102. In one arrangement, for instance, the cable 300 may be at least partially coiled over the first surface 236 of the second channeling device 208 (e.g., such as near where the second channeling device 208 connects to the second side portion 120 of the framework, not shown) before passing through the passageway 260 for eventual connection to the computing device(s) 102 and/or other componentry.

In another arrangement, and as shown in FIG. 3, the cable 300 may be at least partially coiled, folded, or the like into a bundle 304 and disposed within a contaminant removal chamber 268 that is broadly operable to channel or move contaminants (e.g., dripping off of the bundle 304) towards an outer periphery of the rack 100 via gravity. The contaminant removal chamber 268 may be at least partially defined by the first channeling device 204 and a third channeling device 272 secured to the first side portion 116 of the framework 104. For instance, the third channeling device 272 may include opposing first and second surfaces 276, 280 and opposing first and second portions (e.g., edges) 284, 288, where the first portion 284 is secured to or at least adjacent the first side portion 116 of the framework 104 at a first distance (not labeled) from the top portion 108, and where the second portion 288 extends into the storage space 140 of the rack 100 and is spaced from the top portion 108 by a second distance (not shown) less than the first distance.

To facilitate routing of contaminants away from computing devices 102 and/or other componentry of the rack 100 while allowing for cable routing and airflow between the first and second channeling devices 208, 272, the second and third channeling devices 208, 272 may, like the first and second channeling devices 204, 208, be arranged to overlap each other along the first dimension 252 in an overlap region 291 (e.g., which may or may not be at least partially aligned in a vertical direction with overlap region 259) while a passageway 292 is maintained between the same. In this regard, the second portion 288 of the third channeling device 272 may be disposed farther away from the top portion 108 of the framework 104 than are the second portions 224, 248 of the first and second channeling devices 204, 208. Furthermore, one or more perforated connection members 296 (e.g., brackets, plates, etc.) may be secured between (e.g., via welding or the like) or otherwise interconnect the second and third channeling devices 208, 272 for purposes of adding rigidity to the system 200, containing or otherwise holding the cable 300 against movement (e.g., where the cable 300 would pass through a perforation of a connection member 296), and/or the like.

In one embodiment, one or more of the channeling devices 204, 208 (or other channeling devices) may include appropriate number and/or arrangement of lips, ridges, ledges and/or the like designed to channel and/or route contaminants in a particular direction (and/or to limit such contaminants from traveling in a particular direction). For instance, and with continued reference to FIG. 3, the first channeling devices 204 may include at least one lip 225 (not shown in FIG. 2) extending away from the second portion 224 in a direction generally towards the top portion 108 of the framework 104. The lip 225 may serve to limit contaminants from spilling onto the top surface 236 of the second channeling device 208 and/or onto the bottom surface 216 of the first channeling device 204.

As another example, the first channeling device 204 may include another lip 226 (not shown in FIG. 2) extending away from the bottom surface 216 in a direction generally towards the bottom portion 112 of the framework 104 and disposed within the overlap region 259 over the second channeling device 208. The lip 226 may serve to limit contaminants shedding along the bottom surface 216 of the first channeling device 204 from flowing or moving into the removal chamber 268 (or, if the third channeling device 272 is not included, from flowing directly onto computing devices 102) and instead directing such contaminants onto the top surface 236 of the second channeling device 208 for routing towards the second side portion 120 of the framework 104 (e.g., and eventually into any appropriate arrangement of gutters or channels). Similarly, the second channeling device 208 may include a lip 249 (not shown in FIG. 2) extending away from the second portion 248 in a direction generally towards the top portion 108 of the framework 104 to limit contaminants (e.g., dripping off of the bottom surface 216 of the first channeling device 204) from spilling over into the removal chamber 268 and/or onto the computing devices 102). Other lips, ledges and/or the like may also be included as appropriate in the system 100.

Figure 4:
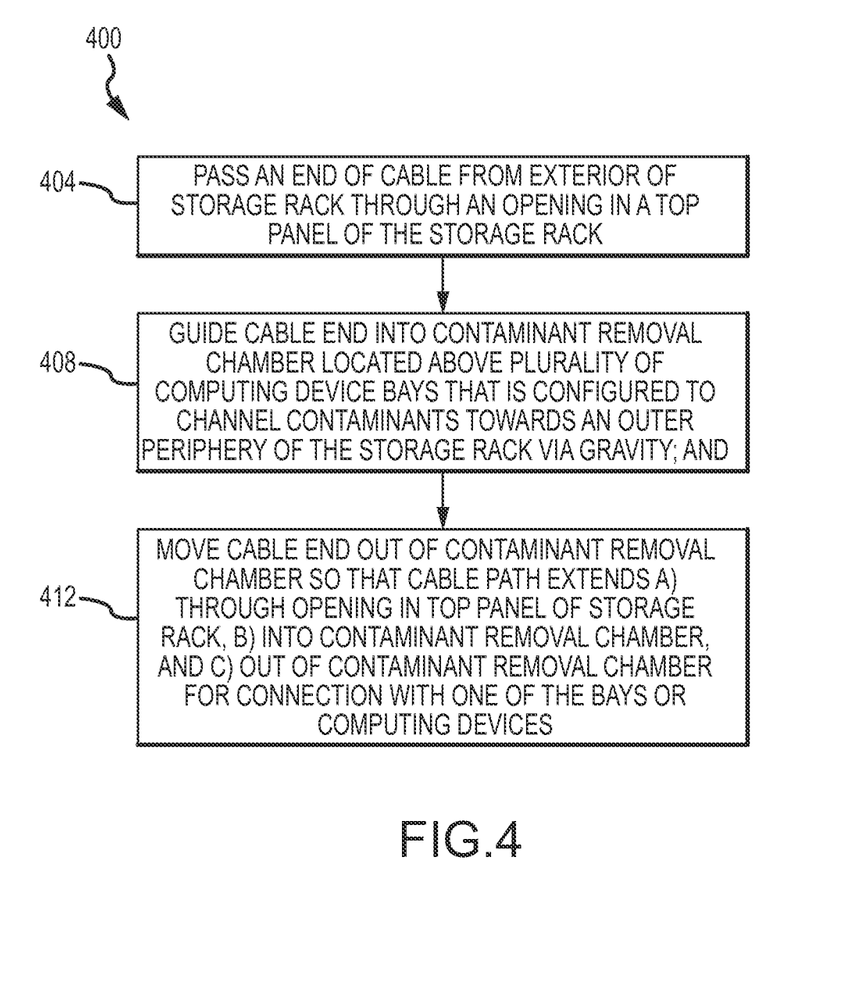
FIG. 4 is a flow diagram illustrating a method of routing one or more cables into the storage rack and contaminant removal system of FIG. 2.

With additional reference now to FIG. 4, a method 400 of routing a cable (e.g., cable 300) between an exterior of a storage rack (e.g. outside of rack 100) and an interior of the storage rack in a manner that reduces the likelihood of the cable channeling or routing contaminants substantially directly to computing devices (e.g., computing device(s) 102) and/or other componentry of the rack. At 404, the method 400 may include passing an end 308 of the cable 300 from an exterior of the rack 100 through an opening (e.g., opening 152) in a top portion or panel (e.g., top panel 148) of the rack 100. The method 400 may then include guiding 408 the end 308 of the cable 300 into a contaminant removal chamber (e.g., contaminant removal chamber 268 in FIG. 3) located above a plurality of bays of the rack 100, where the contaminant removal chamber is configured to channel contaminants towards an outer periphery of the rack 100 via gravity. With reference to FIG. 3, for instance, the end 308 may be guided over the first surface 236 of the second channeling device 208, under the second surface 216 of the first channeling device 204, and over the first surface 276 of the third channeling device 272 (e.g., through the passageway 260 where the first and second channeling devices 204, 208 overlap), all at least partially substantially simultaneously. The method 400 may also include guiding or otherwise moving 412 the end 308 of the cable 300 out of the contaminant removal chamber 268 (e.g., via passageway 292) so that a cable path of the cable 300 extends a) through the opening 152 in the top panel 148 of the rack 100, b) into the contaminant removal chamber 268, and c) out of the contaminant removal chamber 268 for connection with one of the bays, computing devices 102, and/or other componentry (e.g., as shown in FIG. 3).

In one arrangement, the method 400 may include forming at least a partial loop or bundle (e.g., bundle 304) with a portion of the cable 300, where the bundle 304 is disposed in the contaminant removal chamber 268. For instance, after the end 308 of the cable 300 has been guided 408 into the contaminant removal chamber 268 and moved 412 out of the contaminant removal chamber 268, the bundle 304 may be formed by grasping the cable 300 and then urging the cable 300 into the contaminant removal chamber 268 until the bundle 304 has been formed. As another example, the bundle 304 may be formed and then slid into the contaminant removal chamber 268 (e.g., between first and third channeling devices 208, 272 from an end of the first and third channeling devices 208, 272 adjacent third and fourth side portions 124, 128 of the framework 104). In one arrangement, the cable 300 may be looped/coiled one or more additional times before connection with the computing devices 102 (e.g., adjacent each computing device and/or at other appropriate locations) to further limit contaminants from contacting sensitive electronics within the rack 100. Other manners for forming and disposing a bundle of the cable 300 in contaminant removal chamber 268 are also envisioned and encompassed herein.

It will be readily appreciated that many additions to and/or deviations from the specific embodiments disclosed in the specification may be made without departing from the spirit and scope of the invention. As one example, the channeling devices need not necessarily be limited to substantially planar plates as shown in the drawings. For instance, the channeling devices may be in the form of various other devices or components such as convex plates (e.g., convex in a direction facing the top portion 108), gutters, blocks with channels therein, and/or the like that are configured to intercept contaminants that may other contact computing devices and/or other componentry within a storage rack and route the same to an outer periphery of the rack (i.e., away from the computing devices and/or componentry).

As another example, the present system 200 encompasses numerous different or even more complicated arrangements than those shown to channel contaminants away from computing devices mounted within a rack while facilitating air flow therethrough. For instance, additional layers of channeling devices may be disposed under those shown in FIG. 2-3 or alternative to those shown in FIGS. 2-3 (e.g., connected to the first and second side portions 116, 120 and/or third and fourth side portions 124, 128 which may form alternative or additional contaminant removal chambers) to provide additional levels of protection against damage from contaminants moving (e.g., seeping, dripping, falling, etc) downwardly within the rack (e.g., towards the bottom portion 124 of the framework 104). In one embodiment, a number of elongated gutters or the like (e.g., similar to on the roof of a house) may be disposed about or adjacent the outer periphery of the rack (e.g., horizontally disposed between the vertical support members) and positioned to receive contaminants from one or more of the channeling devices. For instance, such gutters could be arranged to route any contaminants received from the channeling devices into channels of the vertical support members so as to route such contaminants towards the bottom portion of the rack and eventually away from the rack altogether.

In one arrangement, a respective system 100 could be disposed at more than one location in a rack 100, such as at a top of each of a number of sub-compartments within the rack 100 (where each sub-compartment is configured to contain a plurality of computing devices). In another arrangement, the system 100 could be disposed on top of the top portion 108 of the rack 100 (i.e., outside or external to the rack 100). In this regard, the system 100 could channel contaminants away from the storage space 140 of the rack before even entering the rack in the first place while increasing the amount of space within the rack that can be consumed by computing devices 102.

It is also to be understood that the various numerical labels given to particular components or features herein (e.g., "first," "second," etc.) have merely been provided for the purposes of facilitating the reader's understanding of the present disclosure and do not necessarily limit features herein labeled as "first" from being a "second," or vice versa, and/or the like. Furthermore, the present system 100 need not necessarily be limited to racks or cabinets designed to store computing devices and the like in a number of bays in a stacked or side by side manner. That is, the present system 100 may be useful for limiting damage to sensitive electronics and/or other equipment contained within a framework or housing from contaminants (e.g., liquids, debris, etc.) whether or not such electronics/equipment happen to be in a stacked side by side arrangement.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment or arrangement can also be implemented in multiple embodiments or arrangements separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and/or parallel processing may be advantageous. Moreover, the separation of various system components in the embodiments described above should not be understood as requiring such separation in all embodiments, and it should be understood that the described program components and systems can generally be integrated together in a single software and/or hardware product or packaged into multiple software and/or hardware products.

The above described embodiments including the preferred embodiment and the best mode of the invention known to the inventor at the time of filing are given by illustrative examples only.

I claim:

1. A storage rack for supporting one or more computing devices, comprising: a framework comprising opposing top and bottom portions, a plurality of side portions extending between the top and bottom portions, and a storage area between the top, bottom, and plurality of side portions for storing one or more computing devices, wherein the top portion includes a top panel including at least one aperture therethrough; and a plurality of channeling devices secured to the framework above the storage area for channeling contaminants towards an outer periphery of the framework, wherein the plurality of channeling devices comprises: a first channeling device secured to a first of the side portions of the framework, wherein the first channeling device comprises opposed first and second portions, wherein the first portion of the first channeling device is secured to the first side portion of the framework, wherein the second portion of the first channeling device is spaced from the first side portion of the framework, and wherein the second portion of the first channeling device is disposed closer to the top portion of the framework than is the first portion of the first channeling device for channeling contaminants received through the at least one aperture through the top panel towards the first side portion of the framework; and a second channeling device secured to a second of the side portions of the framework, wherein the second side portion is opposite the first side portion of the framework, wherein the second channeling device comprises opposed first and second portions, wherein the first portion of the second channeling device is secured to the second side portion of the framework, wherein the second portion of the second channeling device is spaced from the second side portion of the framework, wherein the second portion of the second channeling device is disposed closer to the top portion of the framework than is the first portion of the second channeling device for channeling contaminants received through the at least one aperture through the top panel towards the second side portion of the framework, and wherein the second portions of the first and second channeling devices at least partially overlap in an overlap region.

2. The storage rack of claim 1, wherein the first and second channeling devices comprise respective first and second baffle plates.

3. The storage rack of claim 2, wherein each baffle plate comprises a first surface generally facing the top portion of the framework and an opposing second surface generally facing the bottom portion of the framework, and wherein the first surface of each baffle plate forms an acute angle with a respective side portion of the framework.

4. The storage rack of claim 1, wherein each of the first and second side portions comprises at least one channel extending between the top and bottom portions of the framework, and wherein each channeling device is configured to route contaminants into the channel of one of the first and second side portions.

5. The storage rack of claim 1, wherein the framework defines a first dimension extending from the first side portion to the second side portion, wherein the framework defines a second dimension extending from a third side portion to a fourth side portion of the framework, wherein the first and second dimensions are substantially perpendicular to each other, and wherein each of the first and second channeling devices spans a substantial entirety of the second dimension.

6. The storage rack of claim 5, wherein the overlap region is along the first dimension.

7. The storage rack of claim 1, further comprising:
a connection member secured between the first and second channeling devices, wherein the connection member comprises at least one aperture therethrough.

8. The storage rack of claim 1, wherein the second portion of the first channeling device is disposed closer to the top portion of the framework than is the second portion of the second channeling device.

9. The storage rack of claim 8, wherein the plurality of channeling devices further comprises:
a third channeling device secured to the first side portion of the framework, wherein the third channeling device comprises opposed first and second portions, wherein the first portion of the third channeling device is secured to the first side portion of the framework, wherein the second portion of the third channeling device is disposed closer to the top portion of the framework than is the first portion of the third channeling device for channeling contaminants towards the first side portion of the framework, wherein the third channeling device at least partially overlaps the second channeling device, and wherein the second portions of each of the first and second channeling devices are disposed closer to the top portion of the framework than is the second portion of the third channeling device.

10. The storage rack of claim 9, further comprising:
a chamber defined by the first channeling device, the third channeling device, and the first side portion of the framework, wherein the chamber is configured to store a portion of cabling extending between an outside of the rack and one or more computing devices mounted within the storage area.

11. A method, comprising: passing an end of a cable from an exterior of the storage rack of claim 10 through the at least one aperture in the to panel of the storage rack, guiding the end of the cable into the chamber; and moving the end of the cable out of the chamber, wherein a cable path of the cable extends a) through the at least one aperture in the top panel of the storage rack, b) into the chamber, and c) out of the chamber for connection with one or more computing devices mounted within the storage area.

12. The method of claim 11, further comprising:
forming at least a partial loop with the cable, wherein the partial loop is disposed in the chamber.

13. The method of claim 12, wherein the forming comprises:
grasping the cable; and
urging the cable into the chamber to form the at least one loop.

14. The method of claim 11, wherein the guiding comprises:
first guiding the end of the cable over the second channeling device;
second guiding the end of the cable under the first channeling device; and
third guiding the end of the cable over the third channeling device.

15. The method of claim 11, further comprising after the moving:
  interconnecting the end of the cable with at least one computing device in the storage rack.

16. A method, comprising: passing an end of a cable from an exterior of the storage rack of claim 1 through the at least aperture in the to panel of the storage rack, guiding the end of the cable into a contaminant removal chamber that is at least partially defined by the first channeling device; and moving the end of the cable out of the contaminant removal chamber, wherein a cable path of the cable extends a) through the at least one aperture in the top panel of the storage rack, b) into the contaminant removal chamber, and c) out of the contaminant removal chamber for connection with one or more computing devices mounted within the storage area.

17. The method of claim 16, further comprising:
  forming at least a partial loop with the cable, wherein the partial loop is disposed in the chamber, wherein the forming comprises:
    grasping the cable; and
    urging the cable into the chamber to form the at least one loop.

18. The storage rack of claim 1, wherein the first channeling device is spaced from the second side portion of the framework, and wherein the second channeling device is spaced from the first side portion of the framework.

19. A storage rack for supporting one or more computing devices, comprising: a framework comprising opposing top and bottom portions, a plurality of side portions extending between the top and bottom portions, and a storage area between the top, bottom, and plurality of side portions for storing one or more computing devices; a plurality of channeling devices secured to the framework above the storage area for channeling contaminants towards an outer periphery of the framework, wherein the plurality of channeling devices comprises: a first channeling device secured to a first of the side portions of the framework, wherein the first channeling device comprises opposed first and second portions, and wherein the second portion of the first channeling device is disposed closer to the top portion of the framework than is the first portion of the first channeling device for channeling contaminants towards the first side portion of the framework; and a second channeling device secured to a second of the side portions of the framework, wherein the second channeling device comprises opposed first and second portions, wherein the second portion of the second channeling device is disposed closer to the top portion of the framework than is the first portion of the second channeling device for channeling contaminants towards the second side portion of the framework, and wherein the first and second channeling devices at least partially overlap in an overlap region; and a connection member secured between the first and second channeling devices, wherein the connection member comprises at least one aperture therethrough; wherein the framework defines a first dimension extending from the first side portion to the second side portion, wherein the framework defines a second dimension extending from a third side portion to a fourth side portion of the framework, wherein the first and second dimensions are substantially perpendicular to each other, wherein each of the first and second channeling devices spans a substantial entirety of the second dimension, and wherein the overlap region is along less than an entirety of the first dimension.

20. The storage rack of claim 19, wherein the overlap region is along no more than about 15% of the first dimension.

\* \* \* \* \*

UNITED STATES PATENT AND TRADEMARK OFFICE
CERTIFICATE OF CORRECTION

| | | |
|---|---|---|
| PATENT NO. | : 9,038,831 B2 | Page 1 of 1 |
| APPLICATION NO. | : 13/686136 | |
| DATED | : May 26, 2015 | |
| INVENTOR(S) | : Thomas E. Stewart | |

It is certified that error appears in the above-identified patent and that said Letters Patent is hereby corrected as shown below:

In the Specification

Column 1
Line 56, delete "refracted" and insert therefor --retracted--.

Column 1
Line 60, delete "refracted" and insert therefor --retracted--.

In the Claims

Column 14
Line 44, delete "to panel" and insert therefor --top panel--.

Column 15
Line 7, delete "to panel" and insert therefor --top panel--.

Signed and Sealed this
Sixth Day of October, 2015

Michelle K. Lee
*Director of the United States Patent and Trademark Office*